United States Patent
White et al.

(10) Patent No.: US 10,437,954 B1
(45) Date of Patent: Oct. 8, 2019

(54) SYSTEM AND METHOD FOR RECOMMENDING INTEGRATED CIRCUIT PLACEMENT AND ROUTING OPTIONS

(71) Applicant: Cadence Design Systems, Inc., San Jose, CA (US)

(72) Inventors: David Allan White, San Jose, CA (US); Weifu Li, Raleigh, NC (US)

(73) Assignee: Cadence Design Systems, Inc., San Jose, CA (US)

( * ) Notice: Subject to any disclaimer, the term of this patent is extended or adjusted under 35 U.S.C. 154(b) by 230 days.

(21) Appl. No.: 15/638,668

(22) Filed: Jun. 30, 2017

(51) Int. Cl.
*G06F 17/50* (2006.01)

(52) U.S. Cl.
CPC ...... *G06F 17/5068* (2013.01); *G06F 17/5072* (2013.01); *G06F 17/5077* (2013.01)

(58) Field of Classification Search
USPC ......................................................... 716/113
See application file for complete search history.

(56) References Cited

U.S. PATENT DOCUMENTS

| | | | | |
|---|---|---|---|---|
| 2003/0093763 A1* | 5/2003 | McConaghy | ......... | G06F 17/505 716/102 |
| 2009/0210836 A1* | 8/2009 | Phan Vogel | ........ | G06F 17/5081 716/107 |
| 2009/0254874 A1* | 10/2009 | Bose | ................... | G06F 17/5068 716/113 |
| 2010/0217564 A1* | 8/2010 | Lahner | ................ | G06F 17/5022 703/1 |
| 2014/0137069 A1* | 5/2014 | Duff | ................... | H03H 11/1221 716/132 |

\* cited by examiner

*Primary Examiner* — Mohammed Alam
(74) *Attorney, Agent, or Firm* — Mark H. Whittenberger, Esq.; Holland & Knight LLP

(57) ABSTRACT

The present disclosure relates to a system and method for electronic design recommendations. Embodiments may include receiving, using at least one processor, an electronic design. Embodiments may further include recognizing one or more circuits within the electronic circuit design. Embodiments may also include identifying one or more user-specific circuit performance preferences. Embodiments may further include generating a first set of one or more placement and routing topology recommendations based upon, at least in part, the one or more user-specific circuit performance preferences. Embodiments may also include receiving a selection of at least one of the placement and routing topology recommendations. Embodiments may further include generating a second set of one or more placement and routing topology recommendations based upon, at least in part, the selected at least one placement and routing topology recommendations.

18 Claims, 13 Drawing Sheets

400

424 →
426 → .subckt sd0105_t28hpc_OAI21D0 A1 A2 B ZN VDD VSS
428 → mm8 ZN A2 net26 VSS nch_mac l=40.0n w=0.2u
430 → mm2 ZN A1 net26 VSS nch_mac l=40.0n w=0.2u
432 → mm3 net26 B VSS VSS nch_mac l=40.0n w=0.2u
434 → mm9 ZN B VDD VDD pch_mac l=40.0n w=0.24u
436 → mm1 net064 A2 VDD VDD pch_mac l=40.0n w=0.24u
438 → mm0 ZN A1 net064 VDD pch_mac l=40.0n w=0.24u
.ends 442 →
.subckt sd0105_t28hpc_OAI2ID0 B1 B2 C Z VDD VSS
mm1 Z B2 net60 VSS nch_mac l=40.0n w=0.14u
mm7 net014 B2 VDD VDD pch_mac l=40.0n w=0.17u
mm5 Z C VDD VDD pch_mac l=40.0n w=170.0n
mm8 Z B1 net014 VDD pch_mac l=40.0n w=0.17u
mm2 Z B1 net60 VSS nch_mac l=40.0n w=0.14u
mm3 net60 C VSS VSS nch_mac l=40.0n w=0.14u
.ends

FIG. 4

| Index | 0 | 1 | 2 | 3 | 4 | 5 | 6 |
|---|---|---|---|---|---|---|---|
| Content | D-D Feature Value | D-G Feature Value | D-S Feature Value | G-G Feature Value | G-S Feature Value | S-S Feature Value | Sum of vdd and vss |
| Index | 7 | 8 | 9 | 10 | 11 | 12 | 13 |
| Content | Sum of regular n-device | Sum of high threshold n-device | Sum of low threshold n-device | Sum of regular p-device | Sum of high threshold p-device | Sum of low threshold p-device | Sum of other device |

SYSTEM AND METHOD FOR RECOMMENDING INTEGRATED CIRCUIT PLACEMENT AND ROUTING OPTIONS

FIELD OF THE INVENTION

The present disclosure relates to electronic design recommendations, and more specifically, to a method for recommending integrated circuit placement and routing options.

DISCUSSION OF THE RELATED ART

Custom integrated circuit (IC) designers may have subjective preferences that are difficult to deterministically select and implement in an electronic circuit design. For example, in large digital designs, routers may have significant flexibility in achieving timing and adhering to design rules. In custom IC, however, design rules and performance are important but so are design aesthetics. Often, a user's balance of matching, area, and other circuit performance trade-offs are difficult to algorithmically characterize across many circuits and/or in many contexts. Therefore, it may be of interest to "learn" user preferences and balance those preferences between various performance factors to build a viable system.

SUMMARY OF DISCLOSURE

In one or more embodiments of the present disclosure, a computer-implemented method for electronic design recommendations. The method may include receiving, using at least one processor, an electronic design. The method may further include recognizing one or more circuits within the electronic circuit design. The method may also include identifying one or more user-specific circuit performance preferences. The method may further include generating a first set of one or more placement and routing topology recommendations based upon, at least in part, the one or more user-specific circuit performance preferences. The method may also include receiving a selection of at least one of the placement and routing topology recommendations. The method may further include generating a second set of one or more placement and routing topology recommendations based upon, at least in part, the selected at least one placement and routing topology recommendations.

One or more of the following features may be included. In some embodiments, recognizing the one or more circuits within the electronic circuit design may include extracting one or more feature vectors from a netlist of each of the one or more circuits within the electronic circuit design. The method may also include receiving one or more feature vectors associated with one or more pre-defined circuits and building a feature vector library based upon, at least in part, the one or more feature vectors associated with the one or more pre-defined circuits. Recognizing the one or more circuits from at least a portion of the electronic circuit design may include matching each of the one or more circuits within the electronic circuit design to the one or more pre-defined circuits stored in the feature vector library based upon, at least in part, a comparison of the extracted feature vectors of each of the one or more circuits within the electronic circuit design and the one or more feature vectors associated with the one or more pre-defined circuits stored in the feature vector library.

In some embodiments, identifying the one or more user-specific circuit performance preferences may include receiving one or more placement and routing options associated with one or more pre-defined circuits and receiving one or more training circuit performance preference vectors. Identifying the one or more user-specific circuit performance preferences may include classifying each placement and routing option associated with each pre-defined circuit into one or more categories based upon, at least in part, the one or more training circuit performance preference vectors and building a placement and routing topology option library based upon, at least in part, the one or more placement and routing options associated with each pre-defined circuit. In some embodiments, the one or more placement and routing options associated with pre-defined circuit may be stored within a sub-group specific to each pre-defined circuit. The method may also include providing a placement and routing options library address for one or more placement and routing topology options associated with the one or more circuits within the electronic circuit design.

In some embodiments, identifying the one or more user-specific circuit performance preferences may include identifying a sub-group specific to the one or more circuits within the electronic circuit design, based upon, at least in part, the placement and routing options library address associated with the one or more circuits within the electronic circuit design. Identifying the one or more user-specific circuit performance preferences may also include receiving one or more user-specific circuit performance preference vectors. Identifying the one or more user-specific circuit performance preferences may further include identifying a category of placement and routing topology recommendations from the identified sub-group based upon, at least in part, the user-specific circuit performance preference vector. In some embodiments, generating one or more of the first set and the second set of one or more placement and routing topology recommendations may be based upon, at least in part, machine learning methods.

In one or more embodiments of the present disclosure, a system for electronic design recommendations is provided. The system may include one or more processors configured to receive an electronic design. The at least one processor may be further configured to recognize one or more circuits within the electronic circuit design. The at least one processor may be further configured to identify one or more user-specific circuit performance preferences. The at least one processor may be further configured to generate a first set of one or more placement and routing topology recommendations based upon, at least in part, the one or more user-specific circuit performance preferences. The at least one processor may also be configured to receive a selection of at least one of the placement and routing topology recommendations. The at least one processor may be further configured to generate a second set of one or more placement and routing topology recommendations based upon, at least in part, the selected at least one placement and routing topology recommendations.

One or more of the following features may be included. In some embodiments, recognizing the one or more circuits within the electronic circuit design may include extracting one or more feature vectors from a netlist of each of the one or more circuits within the electronic circuit design. The at least one processor may be further configured to receive one or more feature vectors associated with one or more pre-defined circuits and building a feature vector library based upon, at least in part, the one or more feature vectors associated with the one or more pre-defined circuits. Recognizing the one or more circuits from at least a portion of the electronic circuit design may include matching each of the one or more circuits within the electronic circuit design to the one or more pre-defined circuits stored in the feature vector library based upon, at least in part, a comparison of the extracted feature vectors of each of the one or more circuits within the electronic circuit design and the one or more feature vectors associated with the one or more pre-defined circuits stored in the feature vector library.

In some embodiments, identifying the one or more user-specific circuit performance preferences may include receiving one or more placement and routing options associated with one or more pre-defined circuits and receiving one or more training circuit performance preference vectors. Identifying the one or more user-specific circuit performance preferences may include classifying each placement and routing option associated with each pre-defined circuit into one or more categories based upon, at least in part, the one or more training circuit performance preference vectors and building a placement and routing topology option library based upon, at least in part, the one or more placement and routing options associated with each pre-defined circuit. In some embodiments, the one or more placement and routing options associated with pre-defined circuit may be stored within a sub-group specific to each pre-defined circuit. The at least one processor may be further configured to provide a placement and routing options library address for one or more placement and routing topology options associated with the one or more circuits within the electronic circuit design.

In some embodiments, identifying the one or more user-specific circuit performance preferences may include identifying a sub-group specific to the one or more circuits within the electronic circuit design, based upon, at least in part, the placement and routing options library address associated with the one or more circuits within the electronic circuit design. Identifying the one or more user-specific circuit performance preferences may also include receiving one or more user-specific circuit performance preference vectors. Identifying the one or more user-specific circuit performance preferences may further include identifying a category of placement and routing topology recommendations from the identified sub-group based upon, at least in part, the user-specific circuit performance preference vector. In some embodiments, generating one or more of the first set and the second set of one or more placement and routing topology recommendations may be based upon, at least in part, machine learning methods.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

FIG. 4 is a diagram depicting circuit netlists in accordance with the present disclosure;

DETAILED DESCRIPTION

Figure 1:
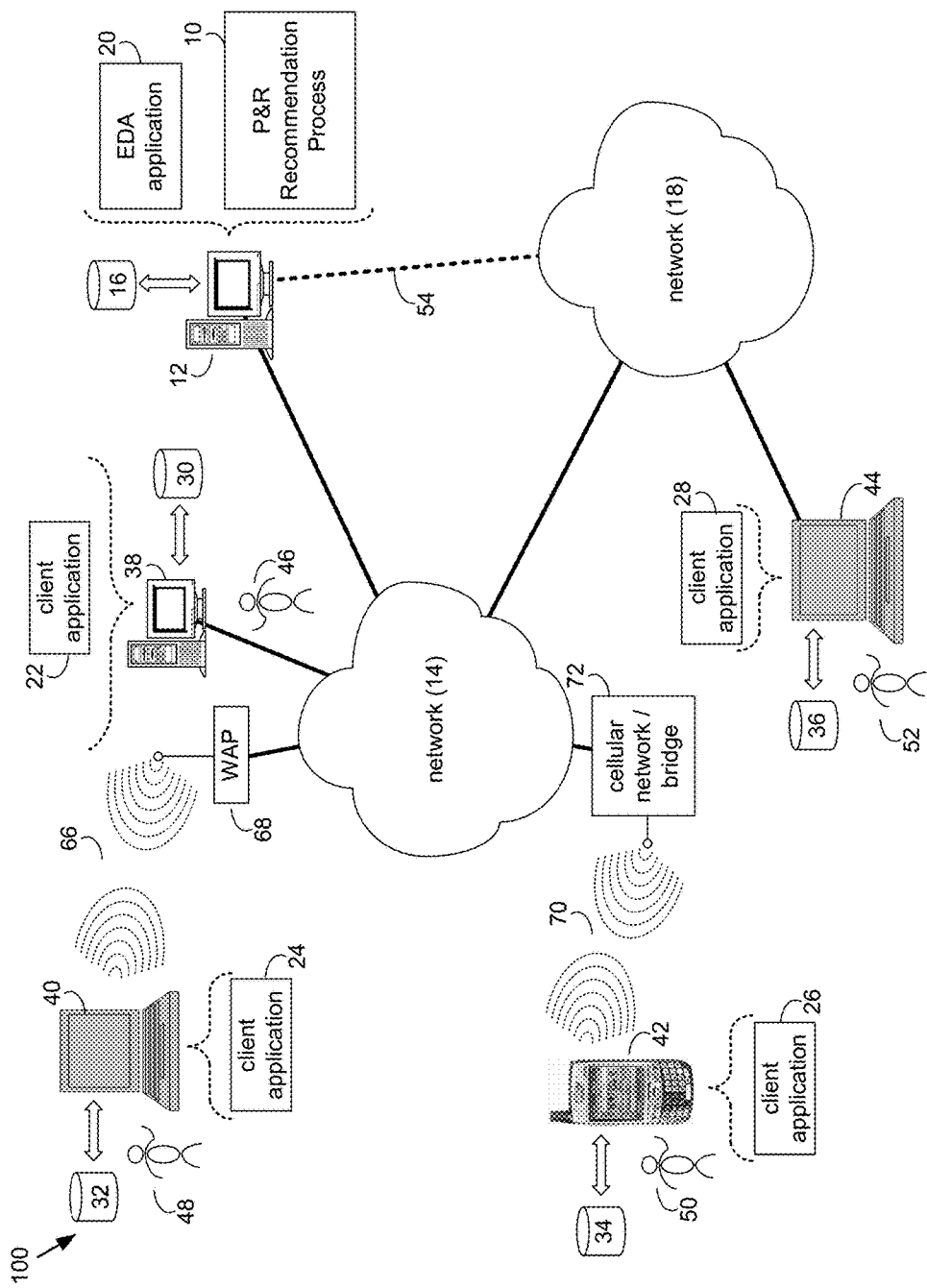
FIG. 1 is a diagram depicting an embodiment of a system in accordance with the present disclosure.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

One or more hardware description languages may be used in accordance with the present disclosure. Some hardware description languages may include, but are not limited to, Verilog, VHDL, SystemC, SystemVerilog and Verilog-AMS. Various other hardware description languages may also be used as well.

Referring to FIG. 1, there is shown a placement and routing (P&R) recommendation process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, P&R recommendation process 10 may reside on and be executed, in whole or in part, by a client electronic device, such as a personal computer, notebook computer, personal digital assistant, or the like.

The instruction sets and subroutines of P&R recommendation process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for electronic design optimization.

P&R recommendation process 10 may be a stand-alone application, or may be an applet/application/script that may interact with and/or be executed within EDA application 20. In addition/as an alternative to being a server-side process, P&R recommendation process 10 may be a client-side process (not shown) that may reside on a client electronic device (described below) and may interact with an EDA client application (e.g., one or more of EDA client applications 22, 24, 26, 28). Further, P&R recommendation process 10 may be a hybrid server-side/client-side process that may interact with EDA application 20 and an EDA client application (e.g., one or more of client applications 22, 24, 26, 28). As such, P&R recommendation process 10 may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize P&R recommendation process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.).

Figure 2:
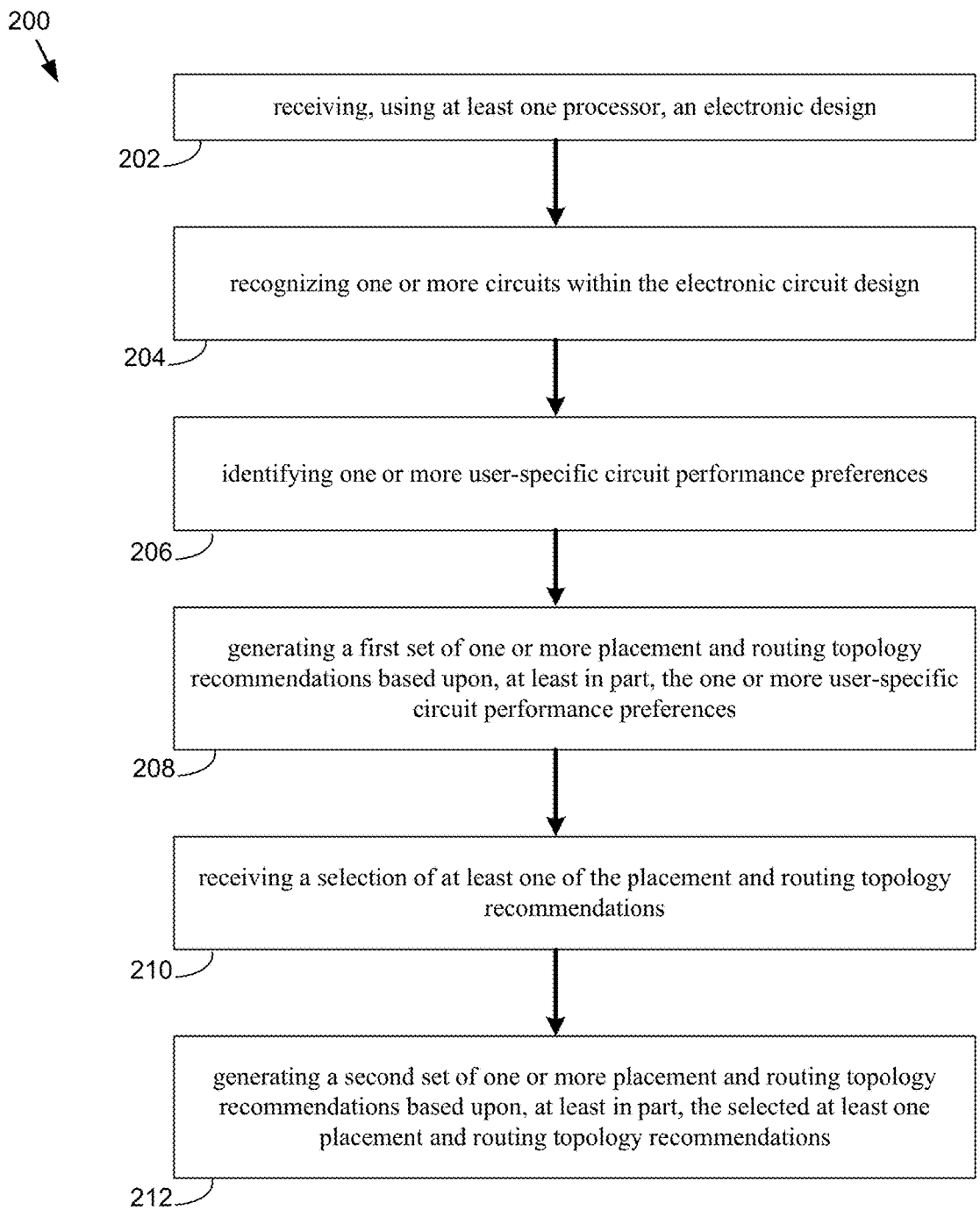
FIG. 2 is a flowchart depicting operations consistent with the placement and routing (P&R) recommendation process in accordance with an embodiment of the present disclosure.

Referring now to FIG. 2, an exemplary flowchart 200 depicting operations consistent with P&R recommendation process 10 is provided. Embodiments may include receiving (202), using at least one processor, an electronic circuit design and recognizing (204) one or more circuits within the electronic circuit design. Embodiments may further include identifying (206) one or more user-specific circuit performance preferences. Embodiments may also include generating (208) a first set of one or more placement and routing topology recommendations based upon, at least in part, the one or more user-specific circuit performance preferences. Embodiments may further include receiving (210) a selection of at least one of the placement and routing topology recommendations. Embodiments may also include generating (212) a second set of one or more placement and routing topology recommendations based upon, at least in part, the selected at least one placement and routing topology recommendations.

In some embodiments, P&R recommendation process 10 may receive an electronic circuit design. An electronic circuit design as used herein may include, but is not limited to, a representation of one or more circuits that may be designed, simulated, tested, and/or verified to enable the one or more electronic circuits to carry out one or more instructions, as is known in the art. A circuit, input circuit, circuit block, electronic circuit, and/or cell, as used herein may include but is not limited to, a software representation or schematic of one or more hardware components used in the modeling and/or simulation of an electronic circuit design. As will be discussed in greater detail below, for any given input circuit within the received electronic circuit design, there may be multiple options for both layout (e.g., placement) and routing of the input circuit within the electronic circuit design.

Figure 3:
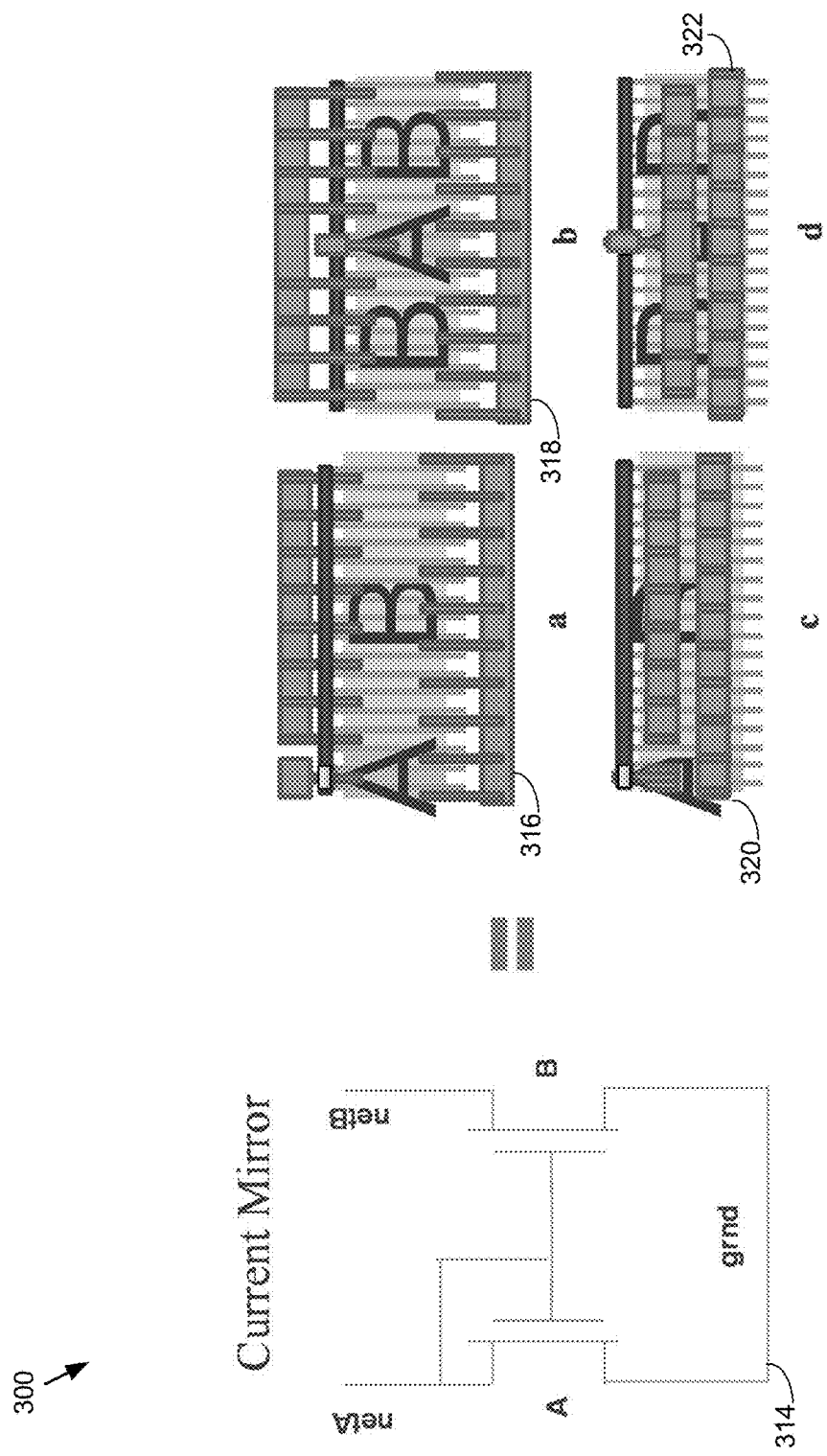
FIG. 3 is a diagram depicting an embodiment in accordance with the present disclosure.

Referring now to the example of FIG. 3, one or more circuits may be within an electronic circuit design. In one example, an input circuit 314 (e.g., current mirror 314) may represent at least a portion of an electronic design. For input circuit 314, there may be different combinations of placement and routing (P&R) topologies that may provide trade-off among various circuit performance factors. Examples of performance factors may include, but are not limited to, matching, area, capacitance, etc. In the example of FIG. 3, there may be four example P&R options, 316, 318, 320, 322. In one example, P&R option 318 may have better matching and less capacitance, but more require more area. As will be described in greater detail below, P&R recommendation process 10 may have the flexibility of providing different combinations of P&R topologies for the same circuit, cell, or block based upon, at least on part, user-specific circuit performance requirements and/or user-specific circuit performance preferences within the same chip. Additionally and/or alternatively, P&R recommendation process 10 may learn user-specific circuit performance requirements and/or user-specific circuit performance preferences and incorporate those learned user requirements and/or preferences into P&R design recommendations while balancing requirements in area, matching, etc. to build a commercially viable system.

In some embodiments, P&R recommendation process 10 may provide a library-based system capable of providing optimized combination(s) of P&R topologies for a given circuit or a series of sub-circuits based on one or more user-specific circuit performance preferences and/or circuit performance requirements. In some embodiments, the P&R topology for instances of a standard cell or circuit like an "AND" gate, a "IOA" gate, etc. may change with different areas of an electronic circuit design and/or different circuit performance requirements. In some embodiments P&R recommendation process 10 may not generate or create new placement or routing topology options. For example, P&R recommendation process 10 may be "library-based" which may include "learning" a P&R topology option of a target circuit before the target circuit is placed within the electronic circuit design. However and as will be discussed in greater detail below, P&R recommendation process 10 may be able to add new input circuits into the library.

In some embodiments, P&R recommendation process 10 may include recognizing one or more circuits within the electronic circuit design. Recognizing the one or more circuits within the electronic design may include extracting one or more feature vectors from a netlist of each of the one or more circuits within the electronic circuit design. In some embodiments, P&R recommendation process 10 may identify a circuit schematic 314 within the electronic circuit design. P&R recommendation process 10 may generate a netlist from the circuit schematic. A netlist as used herein may include but is not limited to a description of the connectivity of an electronic circuit. Additionally and/or alternatively, P&R recommendation process 10 may receive a circuit netlist associated with one or more circuits within the electronic circuit design.

Referring also to the example of FIG. 4, two input circuits may be received. From these input circuits, P&R recommendation process 10 may generate a netlist for each circuit. Additionally and/or alternatively, two input circuit netlists may be received. The first input circuit netlist 424 may include a sub circuit 426 with one or more devices 428, 430, 432, 434, 436, 438. Example devices may include, but are not limited to, transistors, capacitors, inductors, resistors, diodes, etc. In one example, device 428 of sub circuit 426 may be a transistor with one or more characteristics defined in the netlist. For example, device 428 may have the following characteristics defined in the netlist: an instance name of "m8"; a drain node connection named "ZN"; a gate node connection named "A2"; a source node connection named "net26"; a body node connection named "VSS"; a model name of "nch_m ac"; a length of "40.0 nm"; and/or a width of "0.2 μm". While these characteristics of a transistor have been discussed, other characteristics specific to other devices are within the scope of the present disclosure.

Figure 5:
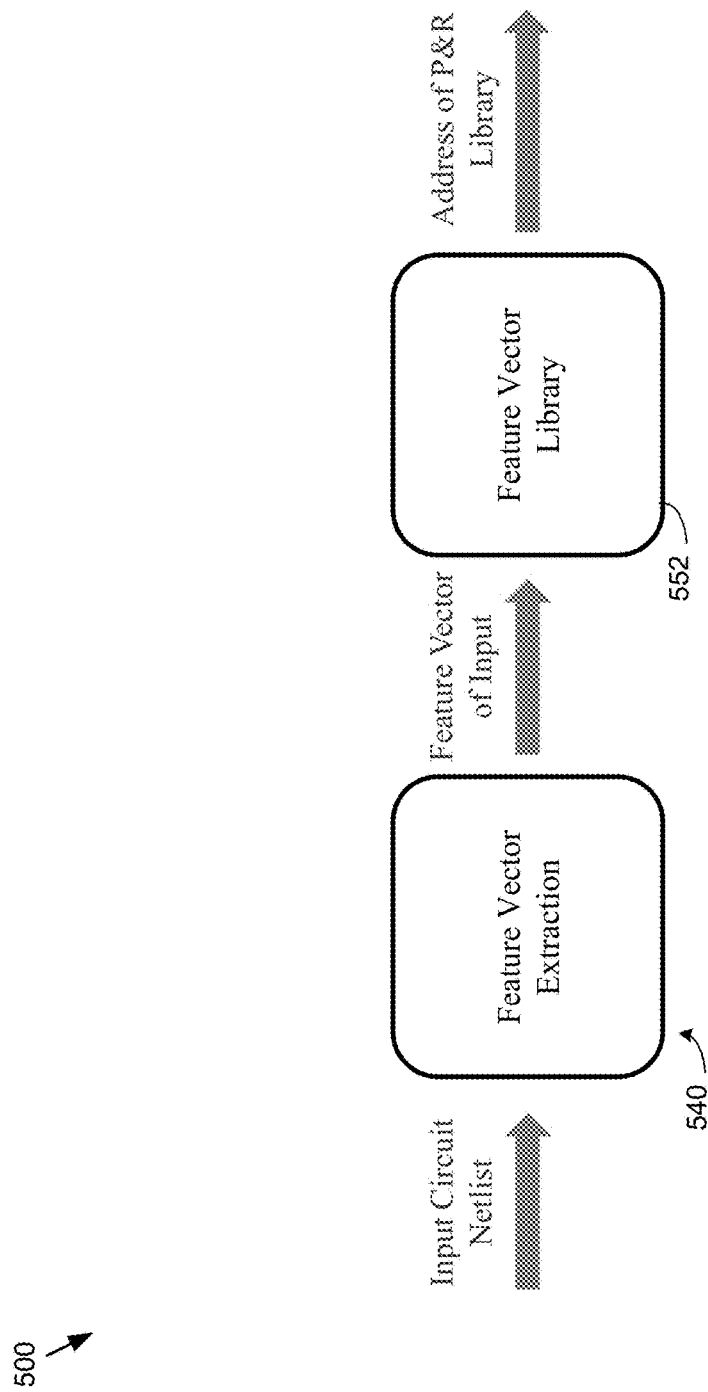
FIG. 5 is a diagram depicting an embodiment in accordance with the present disclosure.

Referring also to FIG. 5, a feature vector may be extracted (e.g., via feature vector extraction 540) from an input circuit netlist. A feature vector, as used herein, may include but is not limited to a vector with internal circuit connection configurations such as drain-to-gate connection information, gate-to-source connection information, etc. for a given input circuit. In some embodiments, a feature vector may be an n-dimensional vector of numerical features that represent some object used in pattern recognition and machine learning. The feature vector may also include information such as the number of metal-oxide-semiconductor field-effect transistor (MOSFET) devices and the number of internal connections within the input circuit. A feature vector may provide a unique expression for each input circuit which may be independent of different transistor orders, wire names, or transistor names. For example, the expression of a circuit netlist may be flexible as the circuit name, the order of transistors in the circuit netlist, etc. may be individually defined for each input circuit netlist. However, in some embodiments, the internal connection(s) between components may be constant and unique for each circuit. As discussed above, a feature vector may include information about these internal circuit connection configurations and, as such, may be considered to be a unique "I.D." for a given input circuit.

Returning to the example of FIG. 4, while first input circuit netlist 424 and second input circuit netlist 442 may each include unique transistor orders, wire names, and/or transistor names, the internal circuit connection configuration (in this example) may be the same and may uniquely identify an "OR-AND-INVERT" (OAI) gate. In some embodiments, P&R recommendation process 10 may extract a feature vector unique to the OAI gate described in both first input circuit netlist 424 and second input circuit netlist 442.

Figure 6:
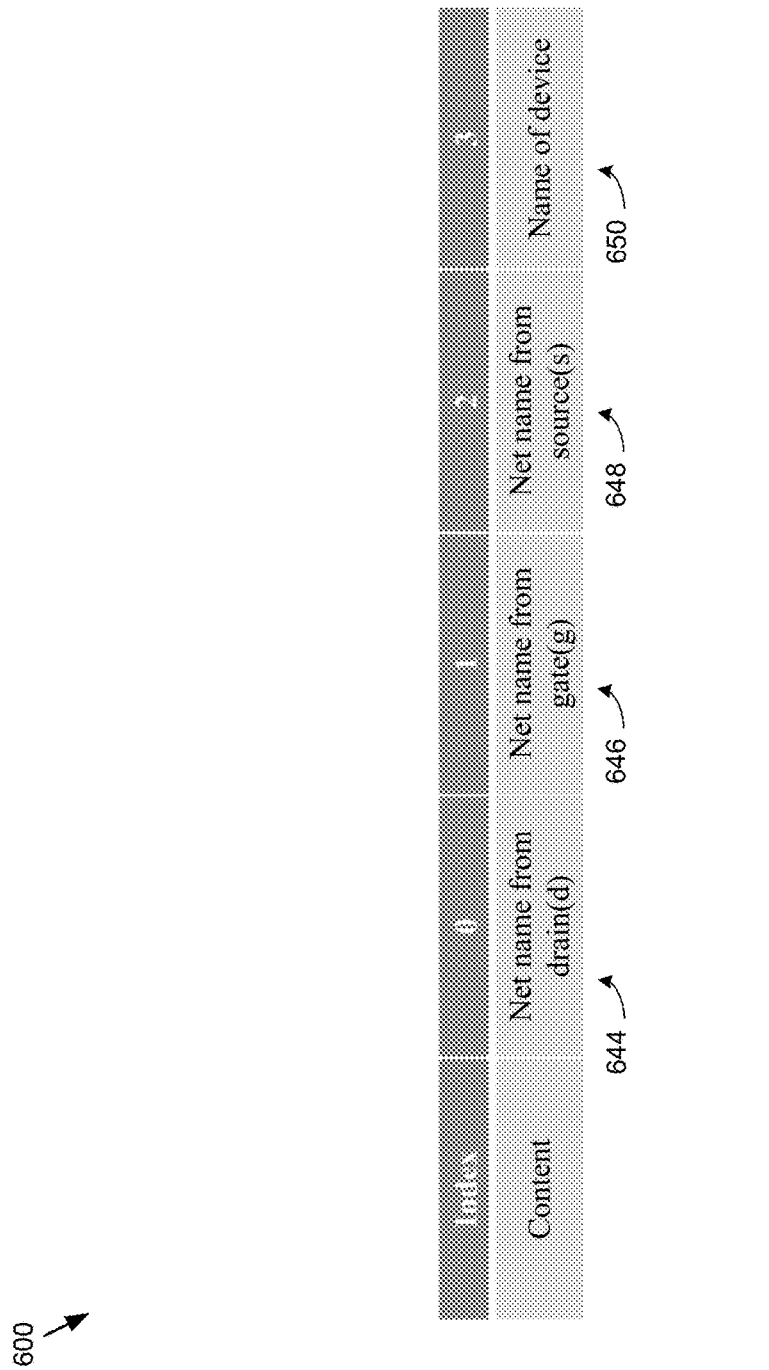
FIGS. 6-7 are diagrams depicting embodiments of feature vectors in accordance with the present disclosure.

Referring also to FIG. 6 and in some embodiments, a feature vector 600 may be an "n×m" vector, where n is a number of devices within a given input circuit and m is a number of characteristics extracted for each device in the input circuit. In some embodiments, four characteristics may be extracted for each device in the input circuit. While four device characteristics have been described, any number of device characteristics may be extracted within the scope of the present disclosure. In some embodiments, each characteristic may be represented as a separate index in the "n×m" vector. In one example, a feature vector may be extracted from an input circuit netlist. The input circuit netlist may include one or more transistors, inductors, and/or capacitors. In some embodiments, each of the devices may be described as a transistor. For example, capacitors and indictors may be considered as a MOSFET with only a drain and gate node.

In one embodiment, a feature vector extracted from the input circuit netlist may include four characteristics of a transistor. Each characteristic may include a list of net names connected to the corresponding node of each transistor. For example, "Net name from drain (d)" 644 may list the net names of each node connected to the drain node of a specific transistor device; "Net name from gate (g)" 646 may list the net names connected to the gate node of a specific transistor device; "Net name from source (s)" 648 may list the net names connected to the source of a specific transistor device; and "Name of device" 650 may include the device name from the input circuit netlist.

Figure 7:

Referring also to FIG. 7 and in some embodiments, feature vector 700 may be extracted from the input circuit netlist and may include a sum of each connection pair, such as a "drain-to-gate (d-g)" or "drain-to-source (d-s)". In some embodiments, the sum of each connection pair may be identified as "x-x feature value" where "x-x" is the starting node and destination node of a given connection pair and may be used as an element in the feature vector of FIG. 7. For example, in a given circuit, there may be multiple connections belonging to the same connection pair (e.g., drain-to-source) and each connection may be represented as a feature value. In some embodiments, the sum of feature values of connections belonging to a connection pair may be referred to as the sum of the connection pair. In some embodiments, the feature value of each connection pair within a given input circuit may be calculated based upon, at least in part, a "weight" of the starting device and the destination device. The "weight" may be the sum of the total connections from all nodes for a given input device.

For example, suppose a MOSFET has three nodes. For each node, there may be multiple connections to that node. The weight of the MOSFET may be the sum of the total number of connections from each node of the MOSFET. In this example, the MOSFET with three nodes may have two connections on each node. The weight of the MOSFET may be six or the total of the number of connections from each node. In another example, suppose a first MOSFET with three nodes has a gate-to-source connection with a second MOSFET (e.g., the gate node of the first MOSFET connected to the source node of the second MOSFET or vice versa). If the first MOSFET with three nodes has two connections on each node and the second MOSFET with three nodes has three connections on each node, the weight of the first MOSFET may be six and the weight of the second MOSFET may be nine. In some embodiments, the feature value of the connection pair may be generated based upon, at least in part, the weight of the first and second MOSFETs. While the above example may include specific connection pairs and/or numbers of connections for each device, this is for purposes of illustration and not of limitation. Any number of devices, connection pairs, connections on each node of each device, etc. are within the scope of the present disclosure.

For any given connection, P&R recommendation process 10 may generate a feature value for each connection pair based upon, at least in part, a "type weight" and the weight of the starting device and the destination device as shown below in Equation 1:

$$[\text{Feature value}](a - \text{to} - b) = \frac{(\text{Device\_Weight}[\text{device\_index\_b}] * \text{Type\_Weight}[\text{type\_index\_b}])}{(\text{Device\_Weight}[\text{device\_index\_a}])} \quad (1)$$

As used herein, the "type weight" may be an arbitrary value for each device type given by the user and/or specified by P&R recommendation process 10 as a predefined value. In some embodiments, each element in feature vector 700 may be the sum of the squared feature value of each connection pair.

In some embodiments, recognizing the one or more circuits within the electronic circuit design may include receiving one or more feature vectors associated with one or more pre-defined circuits. That is, new input circuits may be stored in and/or added to a feature vector library. In this way, P&R recommendation process 10 may "learn" or enter a "training mode" to store feature vectors from each input circuit.

Referring again to FIG. 5, recognizing the one or more circuits within the electronic circuit design may include building a feature vector library 552 based upon, at least in part, the one or more feature vectors associated with one or more pre-defined circuits. A "pre-defined" circuit or "input training circuit" as used herein may include, but is not limited to, a circuit for which the feature vector and/or the P&R options are defined. Examples of pre-defined circuits may include recognizable or standard circuits such as "AND" gates, "OR" gates, current mirrors, etc. For example, the extracted feature vectors of each pre-defined or input training circuit may be used to build and/or add to a feature vector library 552. In some embodiments, each extracted feature vector may be organized in a data structure to build and/or add to the feature library. In one example, each extracted feature vector may be organized in a ball-tree structure to build and/or add to the feature vector library 552. As will be discussed in greater detail below, the feature vector library 552 may store the memory address of corresponding P&R options in a P&R library for each input training circuit. Additionally and/or alternatively, the feature vector library may include one or more feature vectors associated with each input training circuit. In some embodiments, recognizing the one or more circuits within the electronic circuit design may include matching each of the one or more circuits within the electronic circuit design to the one or more pre-defined circuits stored in the feature vector library based upon, at least in part, a comparison of the extracted feature vectors of each of the one or more circuits within the electronic circuit design and the one or more feature vectors associated with the one or more pre-defined circuits stored in the feature vector library. In this way, P&R recommendation process 10 may enter "inference mode" to identify a location or memory address in a P&R options library for P&R options associated with an input circuit. In some embodiments, matching the feature vector may include calculating the Euclidean distance between the feature vector(s) of an input circuit and one or more feature vectors stored in the feature vector library.

In some embodiments, P&R recommendation process 10 may provide a pre-defined number of most closely matching circuits. In one example, the top eight circuits with feature vectors most closely matching the feature vector of the input circuit may be provided. While providing the top eight most closely matching circuits has been described, P&R recommendation process 10 may provide any number of pre-defined most closely matching circuits. Ideally, there should be only one circuit found from the feature vector library with an identical feature vector as the input circuit. As will be discussed in greater detail below, once the matching entry is found, P&R recommendation process 10 may locate the P&R options associated with the input circuit.

Figure 8:
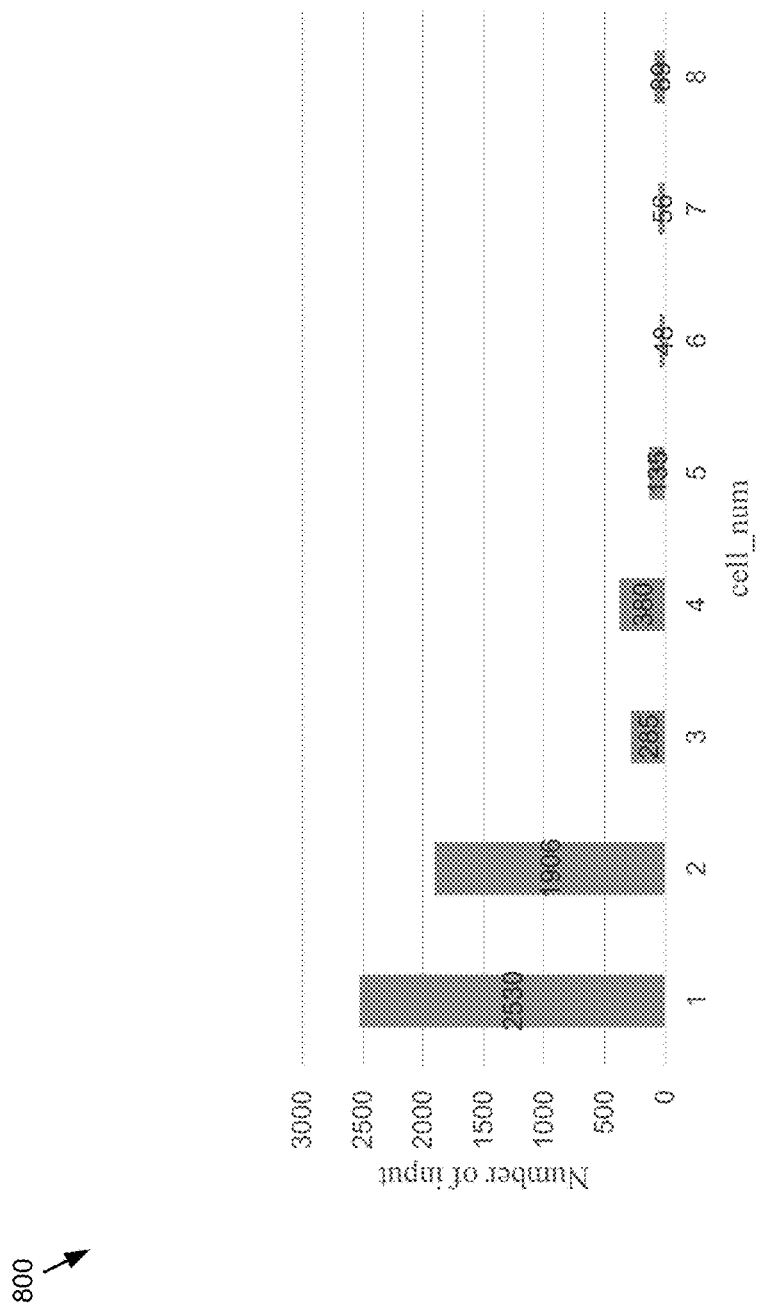
FIGS. 8-9 are diagrams depicting an embodiment in accordance with the present disclosure.

Referring also to the example of FIG. 8, in an embodiment of P&R recommendation process 10, circuit recognition was performed on a test bench of 5,430 basic circuits as shown in graph 800. Out of the 5,430 input circuits, 2,530 of the input circuits had a unique feature vector and only one closely matching circuit, 1,906 of the input circuits matched two feature vectors in the feature vector library (e.g., two closely matching circuits), 285 of the input circuits matched three feature vectors in the feature vector library (e.g., three closely matching circuits), 380 of the input circuits matched four feature vectors in the feature vector library (e.g., four closely matching circuits), 135 of the input circuits matched five feature vectors in the feature vector library (e.g., five closely matching circuits), 48 of the input circuits matched six feature vectors in the feature vector library (e.g., six closely matching circuits), 56 of the input circuits matched seven feature vectors in the feature vector library (e.g., seven closely matching circuits), and 89 of the input circuits matched eight feature vectors in the feature vector library (e.g., eight closely matching circuits).

From the example of FIG. 8, 48.5% of the circuits in the example test bench had a unique feature vector while the remaining input circuits matched to more than one feature vector (e.g., more than one closely matched circuit). In some embodiments, an input circuit may match to more than one feature vector because one or more circuits in the feature vector library may have an identical schematic but may have different transistor sizes. For example, a transistor named as "XOR2D2BWP40P140LVT" and a transistor named as "XOR2D2BWP12T30P140LVT" may have identical schematics and therefore identical feature vectors but different transistor sizes. In some embodiments, the transistor size may not be included in the feature vector because once a matching schematic is found or provided, any sized transistor may utilize the P&R options for that matching schematic. Therefore, only one feature vector may need to be stored in the feature vector library for transistors of different sizes that share a common schematic.

In some embodiments, P&R recommendation process 10 may identify 206 one or more user-specific circuit performance preferences. As discussed above, custom IC designers may have "subjective preferences" that are hard to deterministically select and implement in electronic circuit design. In this way, rather than selecting P&R options for a user, P&R recommendation process 10 may guide a user through "subjective stages" of selecting a P&R topology and may automate the other stages.

Figure 9:
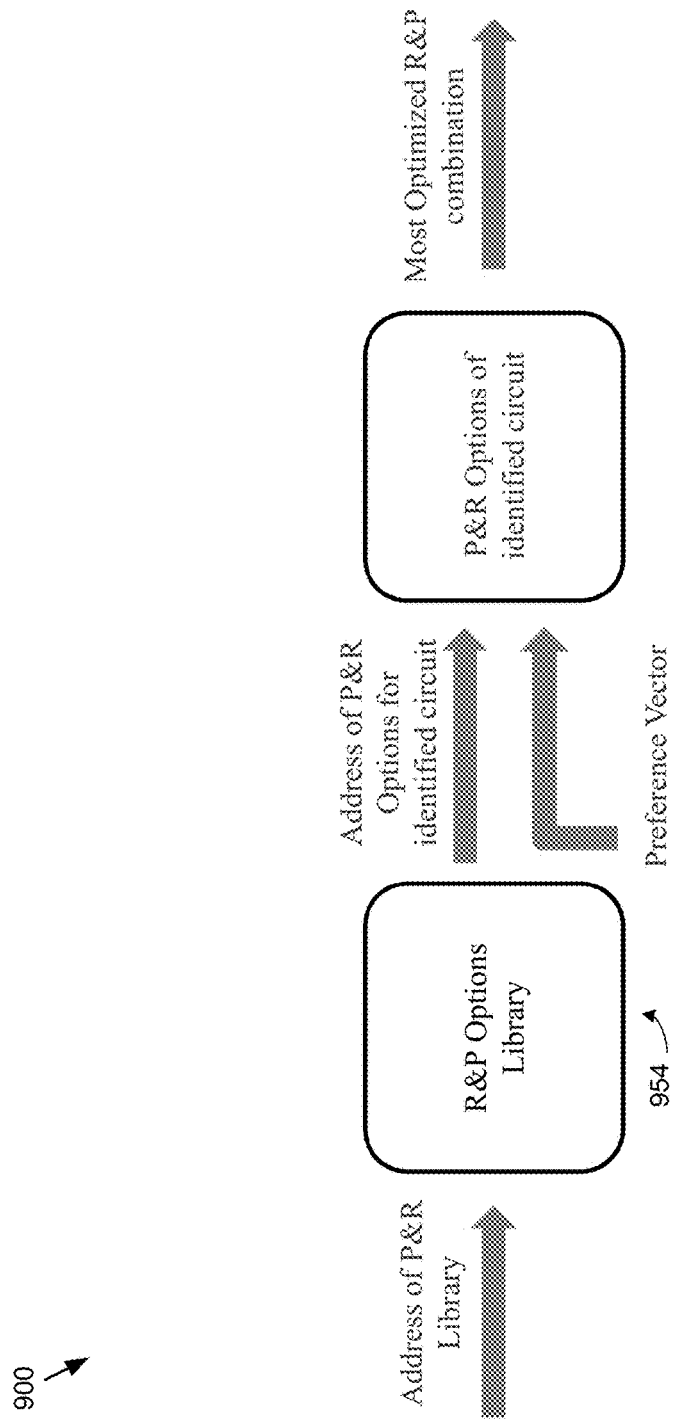

Referring also to FIG. 9 and in some embodiments, identifying the one or more user-specific circuit performance preferences may include building a placement and routing options library or R&P Options Library 954. In this way, P&R recommendation process 10 may "learn" or enter a "training mode" to store placement and feature options for one or more pre-defined circuits. P&R recommendation process 10 may receive one or more placement and routing options associated with the one or more pre-defined circuits. As discussed above, the received placement and routing (P&R) options associated with the one or more pre-defined circuits may provide possible placement and/or routing combinations for a given circuit. Referring again to FIG. 3 and in one example, P&R recommendation process 10 may receive four P&R options 316, 318, 320, 322 associated with current mirror 314. As will be discussed in greater detail below, each of these received P&R options may be stored in R&P Options Library 954.

Figure 10:
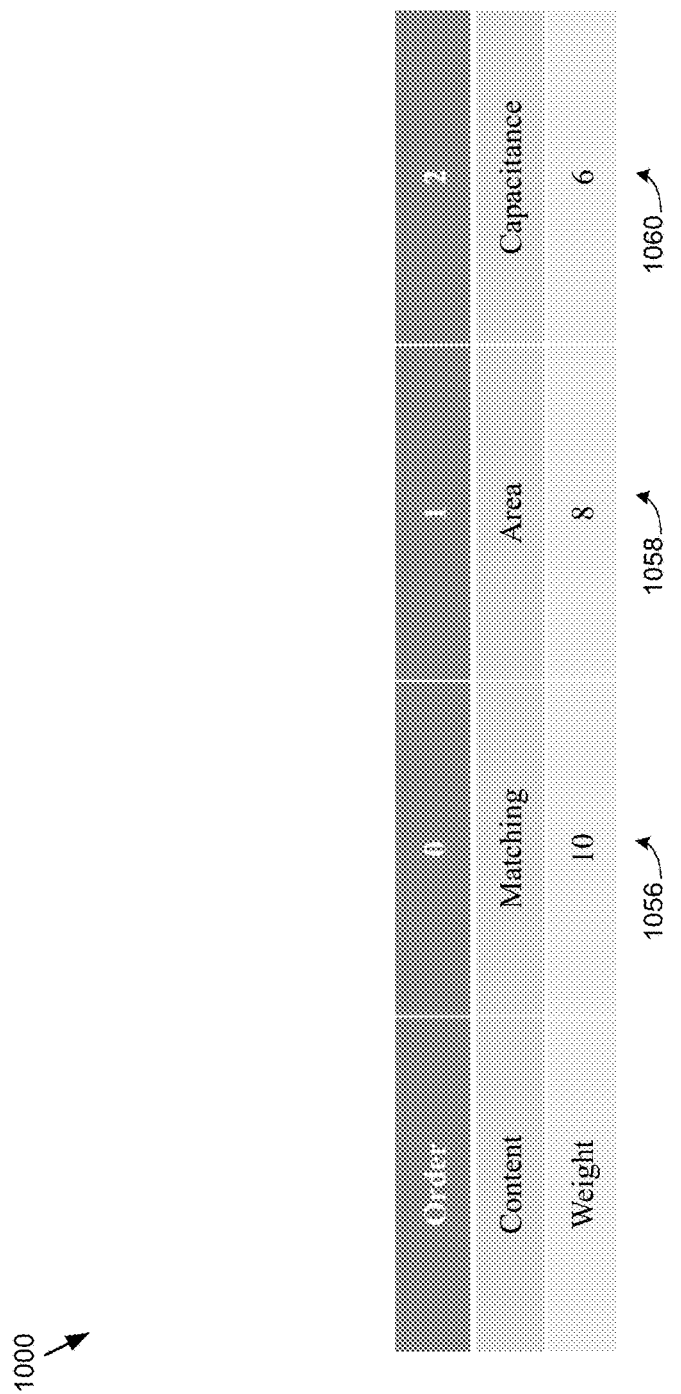
FIG. 10 is a diagram depicting an embodiment of a preference vector in accordance with the present disclosure.

In some embodiments, P&R recommendation process 10 may receive one or more training circuit performance preference vectors. Referring also to FIG. 10, a preference vector 1000 may be an ordered vector describing how much effort to distribute or allocate to one or more circuit performance factors while making the placement and routing of the input circuit. As will be discussed in greater detail below, example circuit performance preference vectors may include training circuit performance preference vector and user-specific performance preference vector. Example performance factors include, but are not limited to, area, matching, parasitic-capacitance, etc. In some embodiments, each position within the preference vector may include a fixed weight. In some embodiments, the larger the weight for a vector element, the higher the priority is for the performance vector. The example preference vector 1000 of FIG. 10 may include a weight of "10" for "Matching" 1056, a weight of "8" for "Area" 1058, and a weight of "6" for "Capacitance" 1060. In this example, P&R recommendation process 10 may give matching the highest priority. Following matching, area may be given the next highest priority. In this example, capacitance may be given the lowest priority. While only three circuit performance preferences have been discussed, other circuit performance preferences are within the scope of the present disclosure.

In some embodiments, P&R recommendation process 10 may classify each placement and routing option associated with each pre-defined circuit into one or more categories based upon, at least in part, the one or more training circuit performance preference vectors. In some embodiments, each of the one or more training circuit performance preference vectors may be associated with one or more pre-defined circuits. In this way, P&R recommendation process 10 may associate the weights of a training circuit performance preference vector with one or more P&R options. For example, P&R options may be classified into one or more categories based upon, at least in part, the one or more training circuit performance preference vectors. Referring again to the example of FIG. 3, suppose P&R recommendation process 10 receives P&R option 316 associated with current mirror 314. Further suppose that P&R recommendation process 10 receives training circuit performance preference vector 1000 associated with P&R option 316.

P&R recommendation process 10 may classify P&R option 316 into a category based upon the weights of training circuit performance preference vector 1000 that prioritizes "Matching" with a relative weight of 10, "Area" with a relative weight of 8", and "Capacitance" with a relative weight of "6". In another example, P&R recommendation process 10 may receive P&R option 318 associated with current mirror 314 and a training circuit performance preference vector (not shown) associated with P&R option 318. In this example, the training performance vector may have weights of "10" for "Area", "8" for "Matching", and/or "6" for Capacitance. P&R recommendation process 10 may classify P&R option 318, in this example, into a category based upon the weights of training circuit performance preference vector that prioritizes "Area" with a relative weight of 10, "Matching" with a relative weight of 8", and "Capacitance" with a relative weight of "6". Other combinations with P&R options and training circuit performance preference vectors are within the scope of the present disclosure.

In some embodiments, the training preference vector for each input circuit may be received from an electronic design automation (EDA) company or source (e.g., via a download, an update, and/or upon installation of EDA application 20) and/or from a user. The "us" can be either EDA company or users. In some embodiments, the training preference vector may be provided for each training circuit during an initial training and/or when the user or EDA company would like to add new circuit into the library. In some embodiments, the user may provide the training preference vector after the circuit schematic is complete, to enable P&R recommendation process 10 to find a best P&R combination within a placement and routing option library, as will be discussed in greater detail below. Regardless of the source of the training preference vector, the training preference vector may provide the "weight" and/or "value" of each element in the training preference vector for a corresponding input circuit.

In some embodiments, P&R recommendation process 10 may build a placement and routing option library (e.g., R&P Option Library 954) based upon, at least in part, the one or more placement and routing options associated with each pre-defined circuit, wherein the one or more placement and routing options associated with pre-defined circuit are stored within a sub-group specific to each pre-defined circuit. Referring also to the example of FIG. 11, P&R recommendation process 10 may store one or more placement and routing options associated with an "AND" circuit in sub-group 1162, one or more placement and routing options associated with an "OR" circuit in sub-group 1164, and one or more placement and routing options associated with an "NAND" circuit in sub-group 1164. In this example, each of the one or more placement and routing options, regardless of the training circuit performance preference vectors received for each P&R option, may be stored in a sub-group associated with a pre-defined circuit. In some embodiments and as will be discussed in greater detail below, P&R recommendation process 10 may store the address of each sub-group and/or each category of R&P Options Library in feature vector library 1152.

Referring again to FIG. 5 and in some embodiments, P&R recommendation process 10 may provide a placement and routing options library address for one or more placement and routing topology options associated with the one or more circuits within the electronic circuit design. In other words, P&R recommendation process 10 may provide a memory address associated with an input circuit for one or more P&R options stored in a P&R library. As discussed above, feature vector library 552 may include a P&R address for each pre-defined circuit.

Figure 12:
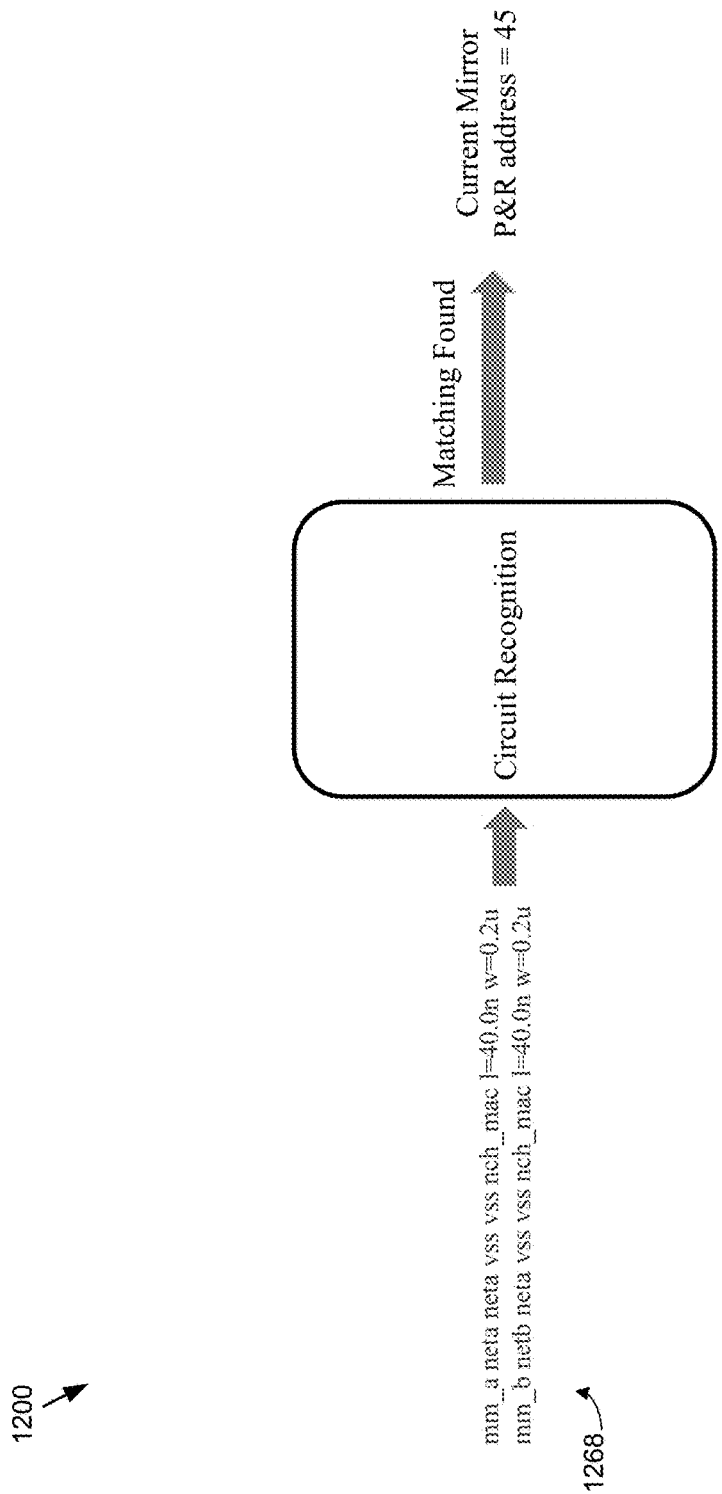
FIG. 12 is a diagram depicting an embodiment in accordance with the present disclosure.

Referring also to the examples of FIGS. 5 and 12, P&R recommendation process 10 may receive one or more circuits and/or identify one or more circuit netlists 1268 from one or more circuits. P&R recommendation process 10 may recognize the one or more circuits by extracting a feature vector from the one or more circuits and matching the extracted feature vector(s) to feature vectors stored in feature vector library 552. P&R recommendation process 10 may recognize that circuit (e.g., one or more circuit netlists 1268) as a current mirror 314. As discussed above, there may be one or more P&R options, 316, 318, 320, 322 for a given current mirror circuit 314. P&R recommendation process 10 may provide the R&P Options Library address associated with current mirror 314 from feature vector library 552 (e.g., P&R Address=45).

Figure 11:
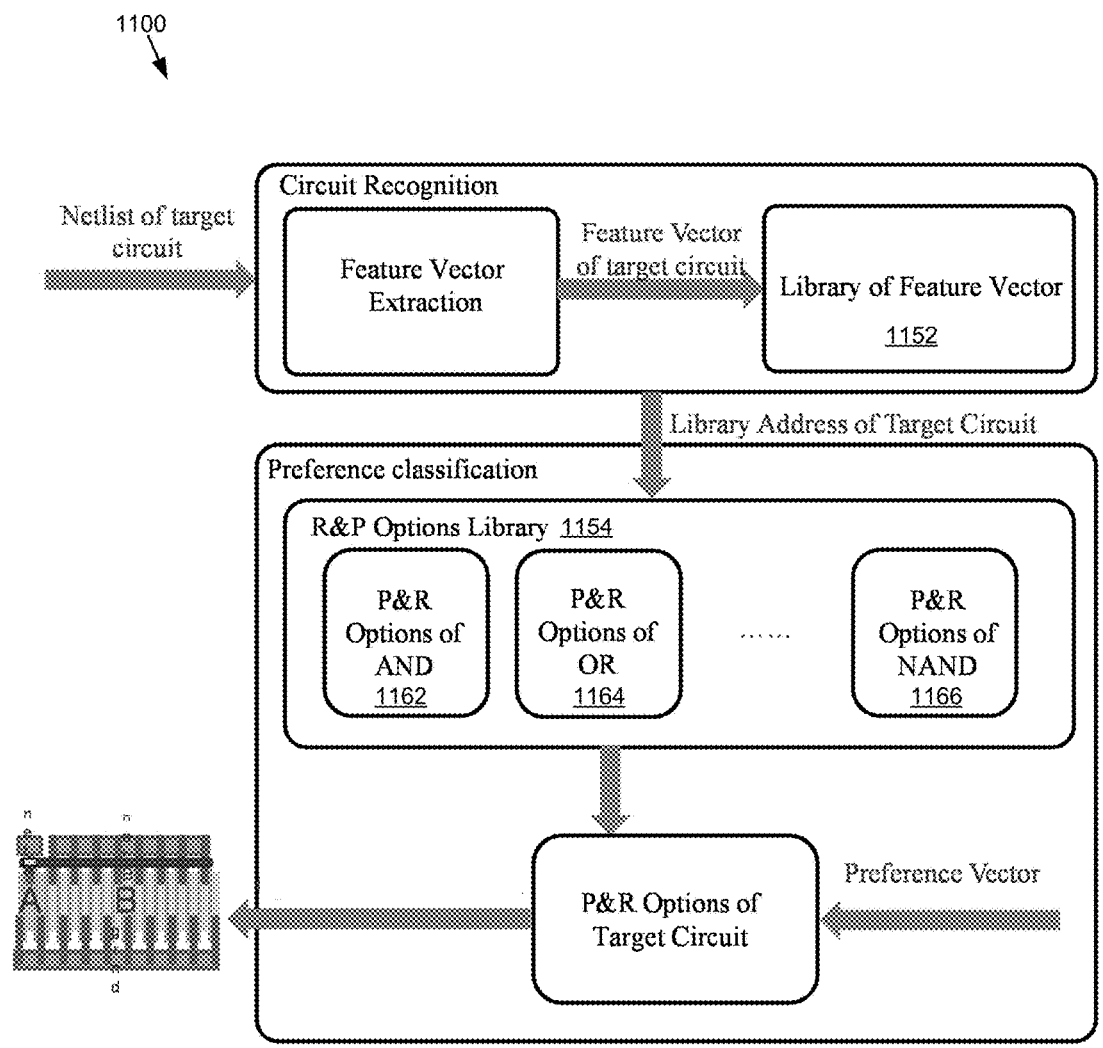
FIG. 11 is a diagram depicting an embodiment in accordance with the present disclosure.

In some embodiments, P&R recommendation process 10 may identify a sub-group specific to the one or more circuits within the electronic circuit design, based upon, at least in part, the placement and routing options library address associated with the one or more circuits within the electronic circuit design. Referring also to the example of FIG. 13, P&R recommendation process 10 may provide the R&P Options Library address associated with a sub-group specific to a current mirror 314. For example, P&R recommendation process 10 may provide a P&R Address=45. Referring also to FIG. 11, P&R recommendation process 10 may identify a sub-group specific to current mirror 314 from the sub-groups within R&P Options Library.

In some embodiments, P&R recommendation process 10 may receive one or more user-specific circuit performance preference vectors. As discussed above, a circuit performance preference vector may be an ordered vector describing how much effort to distribute or allocate to one or more performance factors while making the placement and routing of the input circuit. Example performance factors include, but are not limited to, area, matching, parasitic-capacitance, etc.

In some embodiments, P&R recommendation process 10 may receive the one or more user-specific circuit performance preference vectors from a user interface and/or graphical user interface (not shown) configured to receive a ranking or weight for each of the circuit performance preferences or performance factors. In some embodiments and as will be discussed in greater detail below, P&R recommendation process 10 may generate and/or modify a user-specific circuit performance preference vector based upon, at least in part, a selection of at least one of the one or more ranked P&R topology recommendations.

In some embodiments, P&R recommendation process 10 may identify one or more categories of placement and routing topology recommendations from the identified sub-group based upon, at least in part, the user-specific circuit performance preference vector. As discussed above, P&R recommendation process 10 may classify one or more P&R options into one or more categories based upon, at least in part, the one or more training circuit performance preference vectors. In response to recognizing the one or more circuits within the electronic circuit design, P&R recommendation process 10 may identify a corresponding sub-group of a given input circuit. From within the sub-group associated with the recognized circuit, P&R recommendation process 10 may identify a closest category from the one or more categories based upon, at least in part, the user-specific circuit performance preference vector. For example, suppose P&R recommendation process 10 receives a user-specific circuit performance preference vector with the weights of "10" for "Area", "8" for "Matching", and/or "6" for "Capacitance." In this example, P&R recommendation process 10 may identify one or more categories of placement and routing topology recommendations from the identified sub-group for current mirror 314. For example, P&R recommendation process 10 may identify a pre-defined number of most closely matching categories.

In some embodiments, P&R recommendation process 10 may generate a first set of one or more placement and routing topology recommendations based upon, at least in part, the one or more user-specific circuit performance preferences. In some embodiments and as discussed above, P&R recommendation process 10 may identify a pre-defined number of most closely matching categories based upon, at least in part, the one or more user-specific circuit performance preference vectors. From the identified categories, P&R recommendation process 10 may provide a first set of one or more ranked P&R topology recommendations. In some embodiments, each of the one or more ranked P&R topology recommendations may be probabilistically ranked. That is, each of the one or more ranked P&R topology recommendations may be ranked based upon the probability that a user will select the P&R topology recommendation.

Figure 13:
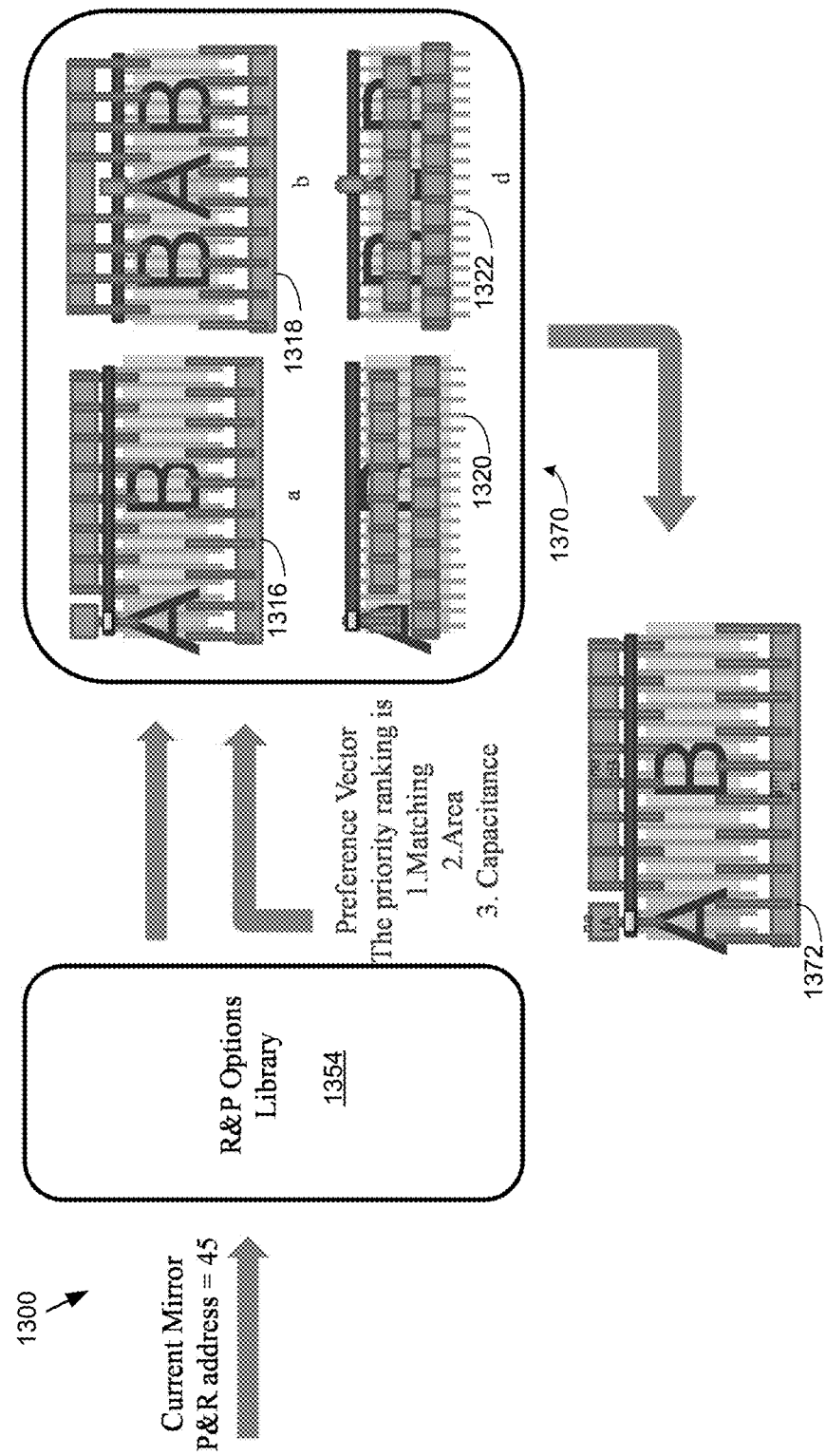
FIG. 13 is a diagram depicting an embodiment in accordance with the present disclosure.

Referring again to the example of FIG. 13, suppose P&R recommendation process 10 receives a user-specific circuit performance preference vector weighting "Matching", then "Area", and finally "Capacitance" in order of priority and/or highest weights. P&R recommendation process 10 may generate a first set 1370 of one or more P&R topology recommendations based upon, at least in part, the user-specific circuit performance preferences. In some embodiments, each of the first set 1370 of one or more P&R topology recommendations may be probabilistically ranked based upon, at least in part, the user-specific circuit performance preferences and/or user-specific circuit performance preference vector(s).

In some embodiments, P&R recommendation process 10 may receive a selection 1372 of at least one of the placement and routing topology recommendations. As discussed above, a user may have "subjective preferences" when deciding upon a particular P&R option. P&R recommendation process 10 may provide ranked options based upon the user-specific circuit performance preferences. Despite the ranked options, a user may select a lower ranked P&R option and P&R recommendation process 10 may implement the selected P&R option 1372 for the one or more circuits within the electronic circuit design.

In some embodiments, P&R recommendation process 10 may implement a P&R topology recommendation from the selected at least one P&R recommendations. In this way, P&R recommendation process 10 may "place and route" the one or more circuits within the electronic circuit design based upon the selected P&R recommendation(s). In some embodiments, P&R recommendation process 10 may implement different instances of the same circuit (e.g., current mirror 314) with different P&R recommendations. Referring also to the example of FIG. 13, suppose for a first current mirror, P&R recommendation process 10 receives a selection 1372 of P&R topology recommendation 1316. However, for a second current mirror, P&R recommendation process 10 receives a selection 1372 of P&R option 1318. As will be discussed in greater detail below, P&R recommendation process 10 may modify the ranking of the first set of one or more P&R topology recommendations to generate a second set of one or more P&R topology recommendations.

In some embodiments, P&R recommendation process 10 may generate a second set of one or more placement and routing topology recommendations based upon, at least in part, the selected at least one placement and routing topology recommendations. For example, P&R recommendation process 10 may modify the user-specific circuit performance preferences and/or the user-specific circuit performance preferences vector, based upon at least in part, the user selection of the one or more P&R topology recommendations. In one embodiment, P&R recommendation process 10 may modify the weights associated with the user-specific circuit performance preferences vector based upon, at least in part, the user selection of the one or more P&R topology recommendations.

For example, P&R recommendation process 10 may compare the weights of the selected P&R topology recommendation(s) with the weights of the user-specific circuit performance preferences vector and may adjust the user-specific circuit performance preferences vector accordingly to reflect the user selected circuit performance preferences of the P&R topology recommendation. In some embodiments, P&R recommendation process 10 may record data relative to a user's habits, such as the usage frequency of each P&R topology during usage of P&R recommendation process 10. In some embodiments, P&R recommendation process 10 may use the recorded user habit data, to modify the weights associated with the user-specific circuit performance preferences vector.

In response to the modified user-specific circuit performance preferences, P&R recommendation process 10 may identify one or more categories of P&R options from the identified sub-group based upon, at least in part, the modified user-specific circuit performance preferences vector. In some embodiments, P&R recommendation process 10 may identify one or more categories of P&R options from the identified sub-group based upon, at least in part, the recorded user habit data. In some embodiments, P&R recommendation process 10 may identify one or more categories of P&R options from the identified sub-group with or without modifying the user-specific circuit performance preferences vector. Additionally and/or alternatively, P&R recommendation process 10 may receive a subsequent selection of one or more circuits for placement and routing within the electronic circuit design. In this way, P&R recommendation process 10 may track at least one of the one or more ranked P&R topology recommendations and one or more user selections to modify the ranking for subsequent recommendations.

In some embodiments, P&R recommendation process 10 may save or otherwise store the selection for future P&R recommendations. For example, P&R recommendation process 10 may receive and recognize one or more circuits for P&R recommendations. For each circuit, P&R recommendation process 10 may store the selections and/or associated weights of the selected P&R topology recommendations for future P&R recommendations. In one example, P&R recommendation process 10 may store multiple selections of P&R topology recommendations with example weighting of "10" for "Area", "8" for "Matching", and/or "6" for Capacitance and P&R recommendation process 10 may modify the user-specific circuit performance preference vector(s) based upon, at least in part, the stored selections of P&R topology recommendations, whether or not the circuits of each recommendation are the same and/or are related.

In some embodiments, P&R recommendation process 10 may generate one or more of the first set and the second set of one or more placement and routing topology recommendations based upon, at least in part, machine learning methods. Machine learning methods as used herein may include, but are not limited to, probabilistic machine learning methods such as logistic regression and/or methods which may compute the probability that a given recommendation is the correct one for the user. In some embodiments, P&R recommendation process 10 may generate one or more of the first set and the second set of one or more placement and routing topology recommendations and display the first set and/or second set of one or more placement and routing topology recommendations to the user via a graphical user interface. In some embodiments, the one of more placement and routing topology recommendations may be provided in a ranked list for the user to choose. That is, P&R recommendation process may define a probability or other "indicator of confidence" that a user will select a specific placement and routing topology recommendation. As described above, there may be non-observable and/or non-deterministic factors that may influence the choice by the user which is why more than one placement and routing topology recommendation may be displayed to the user in order of highest to lower ranking or probability.

In some embodiments, P&R recommendation process 10 may also generate an indicator of confidence or probability associated with each placement and routing topology recommendation. For example, suppose P&R recommendation process 10 generates two placement and routing topology recommendations. For the two placement and routing topology recommendations, P&R recommendation process 10 may generate two probabilities or indicators of confidence that the user will select either recommendation such as, for example, 0.49 and 0.51. In this example, a highest probability that a user will select a recommendation may be associated with a "1.0" and a lowest probability that a user will select the recommendation may be associated with a "0.0." In this case, P&R recommendation process 10 has lower confidence of which recommendation will be selected than if the outputs were, for example, 0.2 and 0.8, respectively.

In some embodiments, P&R recommendation process 10 may track which recommendations are provided and may compare them with what is selected. This difference may be stored as an error or metric for updating the mapping (e.g., user-specific preference vector). As such, in some embodiments, P&R recommendation process 10 may adapt to a user and/or design team's preferences and may "learn" to make better recommendations.

In some embodiments, this may be done by updating the machine learning algorithm directly. For example, P&R recommendation process 10 may receive an additional layers and/or mappings with one or more conditional probabilities associated with a user. In one example, the additional layers and/or mappings may define a probability that a user will choose a specific recommendation based upon, at least in part, an identifying factor such as name, team, group, company, IC type, IC mission, etc. specified in the additional layers or mappings. In some embodiments, P&R recommendation process 10 may include deep learning and/or the addition of layers to an existing base model to update, tune, and/or tailor recommendations for a specific use and/or individual. In some embodiments, this may include the use of convolutional neural networks (CNNs) and/or transfer learning to use a common base model in the initial state. In some embodiments, deep learning layers or final stage classifier(s) may be updated to change the recommendations.

In some embodiments, aspects of P&R recommendation process 10 may be represented as a neural network. For example and as discussed above, P&R recommendation process 10 may "learn" which circuit performance preferences are associated with each placing and routing topology option for a pre-defined circuit. In response to a user-selection of a placement and routing topology recommendation, P&R recommendation process may adjust the user-specific circuit performance preference vector. Additionally, P&R recommendation process 10 may receive additional "layers" or "hidden layers" to increase the accuracy of P&R recommendation process 10. For example and as discussed above, P&R recommendation process may receive layers based on identifying factors such as name, team, group, company, IC type, IC mission, etc.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for electronic design recommendations comprising:
   receiving, using at least one processor, an electronic design;
   recognizing one or more circuits within the electronic circuit design;
   identifying one or more user-specific circuit performance preferences;
   generating a first set of one or more placement and routing topology recommendations based upon, at least in part, the one or more user-specific circuit performance preferences;
   receiving a selection of at least one of the placement and routing topology recommendations; and
   generating a second set of one or more placement and routing topology recommendations based upon, at least in part, the selected at least one placement and routing topology recommendations, wherein generating one or more of the first set and the second set of one or more placement and routing topology recommendations is based upon, at least in part, machine learning methods.

2. The computer-implemented method of claim 1, wherein recognizing the one or more circuits within the electronic circuit design includes:
   extracting one or more feature vectors from a netlist of each of the one or more circuits within the electronic circuit design.

3. The computer-implemented method of claim 2, further comprising:
   receiving one or more feature vectors associated with one or more pre-defined circuits; and
   building a feature vector library based upon, at least in part, the one or more feature vectors associated with the one or more pre-defined circuits.

4. The computer-implemented method of claim 3, wherein recognizing the one or more circuits from at least a portion of the electronic circuit design includes:
   matching each of the one or more circuits within the electronic circuit design to the one or more pre-defined circuits stored in the feature vector library based upon, at least in part, a comparison of the extracted feature vectors of each of the one or more circuits within the electronic circuit design and the one or more feature vectors associated with the one or more pre-defined circuits stored in the feature vector library.

5. The computer-implemented method of claim 1, wherein identifying the one or more user-specific circuit performance preferences includes:
   receiving one or more placement and routing options associated with one or more pre-defined circuits;
   receiving one or more training circuit performance preference vectors;
   classifying each placement and routing option associated with each pre-defined circuit into one or more categories based upon, at least in part, the one or more training circuit performance preference vectors; and
   building a placement and routing topology option library based upon, at least in part, the one or more placement and routing options associated with each pre-defined circuit, wherein the one or more placement and routing options associated with pre-defined circuit are stored within a sub-group specific to each pre-defined circuit.

6. The computer-implemented method of claim 5, further comprising:
   providing a placement and routing options library address for one or more placement and routing topology options associated with the one or more circuits within the electronic circuit design.

7. The computer-implemented method of claim 6, wherein identifying the one or more user-specific circuit performance preferences includes:
   identifying a sub-group specific to the one or more circuits within the electronic circuit design, based upon, at least in part, the placement and routing options library address associated with the one or more circuits within the electronic circuit design.

8. The computer-implemented method of claim 7, wherein identifying the one or more user-specific circuit performance preferences includes:

receiving one or more user-specific circuit performance preference vectors.

9. The computer-implemented method of claim 8, wherein identifying the one or more user-specific circuit performance preferences includes:

identifying a category of placement and routing topology recommendations from the identified sub-group based upon, at least in part, the user-specific circuit performance preference vector.

10. A system for electronic design recommendations comprising:

a computing device having at least one processor configured to receive an electronic design, the at least one processor further configured to recognize one or more circuits within the electronic circuit design, the at least one processor further configured to identify one or more user-specific circuit performance preferences, the at least one processor further configured to generate a first set of one or more placement and routing topology recommendations based upon, at least in part, the one or more user-specific circuit performance preferences, the at least one processor further configured to receive a selection of at least one of the placement and routing topology recommendations, and the at least one processor further configured to a second set of one or more placement and routing topology recommendations based upon, at least in part, the selected at least one placement and routing topology recommendations, wherein generating one or more of the first set and the second set of one or more placement and routing topology recommendations is based upon, at least in part, machine learning methods.

11. The system of claim 10, wherein recognizing the one or more circuits within the electronic circuit design includes:

extracting one or more feature vectors from a netlist of each of the one or more circuits within the electronic circuit design.

12. The system of claim 11, the at least one processor further configured to:

receive one or more feature vectors associated with one or more pre-defined circuits; and build a feature vector library based upon, at least in part, the one or more feature vectors associated with the one or more pre-defined circuits.

13. The system of claim 12, wherein recognizing the one or more circuits from at least a portion of the electronic circuit design includes:

matching each of the one or more circuits within the electronic circuit design to the one or more pre-defined circuits stored in the feature vector library based upon, at least in part, a comparison of the extracted feature vectors of each of the one or more circuits within the electronic circuit design and the one or more feature vectors associated with the one or more pre-defined circuits stored in the feature vector library.

14. The system of claim 10, wherein identifying the one or more user-specific circuit performance preferences includes:

receiving one or more placement and routing options associated with one or more pre-defined circuits;

receiving one or more training circuit performance preference vectors;

classifying each placement and routing option associated with each pre-defined circuit into one or more categories based upon, at least in part, the one or more training circuit performance preference vectors; and build a placement and routing topology option library based upon, at least in part, the one or more placement and routing options associated with each pre-defined circuit, wherein the one or more placement and routing options associated with pre-defined circuit are stored within a sub-group specific to each pre-defined circuit.

15. The system of claim 14, the at least one processor further configured to:

provide a placement and routing options library address for one or more placement and routing topology options associated with the one or more circuits within the electronic circuit design.

16. The system of claim 15, wherein identifying the one or more user-specific circuit performance preferences includes:

identifying a sub-group specific to the one or more circuits within the electronic circuit design, based upon, at least in part, the placement and routing options library address associated with the one or more circuits within the electronic circuit design.

17. The system of claim 16, wherein identifying the one or more user-specific circuit performance preferences includes:

receiving one or more user-specific circuit performance preference vectors.

18. The system of claim 17, wherein identifying the one or more user-specific circuit performance preferences includes:

identifying a category of placement and routing topology recommendations from the identified sub-group based upon, at least in part, the user-specific circuit performance preference vector.

\* \* \* \* \*